United States Patent
Ge et al.

(10) Patent No.: US 10,247,617 B2
(45) Date of Patent: Apr. 2, 2019

(54) MIDDLE-OF-LINE (MOL) METAL RESISTOR TEMPERATURE SENSORS FOR LOCALIZED TEMPERATURE SENSING OF ACTIVE SEMICONDUCTOR AREAS IN INTEGRATED CIRCUITS (ICS)

(71) Applicant: QUALCOMM Incorporated, San Diego, CA (US)

(72) Inventors: Lixin Ge, San Diego, CA (US); Periannan Chidambaram, San Diego, CA (US); Bin Yang, San Diego, CA (US); Jiefeng Jeff Lin, San Diego, CA (US); Giridhar Nallapati, San Diego, CA (US); Bo Yu, San Diego, CA (US); Jie Deng, San Diego, CA (US); Jun Yuan, San Diego, CA (US); Stanley Seungchul Song, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 133 days.

(21) Appl. No.: 15/246,006

(22) Filed: Aug. 24, 2016

(65) Prior Publication Data
US 2018/0058943 A1    Mar. 1, 2018

(51) Int. Cl.
*G01K 7/01* (2006.01)
*G01K 7/24* (2006.01)
(Continued)

(52) U.S. Cl.
CPC ............... *G01K 7/01* (2013.01); *G01K 7/186* (2013.01); *G01K 7/24* (2013.01);
(Continued)

(58) Field of Classification Search
CPC ............. G01K 7/01; G01K 7/24; G01K 7/186
(Continued)

(56) References Cited

U.S. PATENT DOCUMENTS 6,841,843 B2 *  1/2005  Ohkubo ................... G01K 7/01
                                                      257/467
6,948,847 B2     9/2005  Pihet et al.
(Continued)

FOREIGN PATENT DOCUMENTS

JP          3869815 B2 *  1/2007  ............... G01K 7/01

OTHER PUBLICATIONS

International Search Report and Written Opinion for PCT/US2017/043897, dated Oct. 9, 2017, 13 pages.
(Continued)

*Primary Examiner* — Gail Kaplan Verbitsky
(74) *Attorney, Agent, or Firm* — W & T/Qualcomm

(57) ABSTRACT

Middle-of-line (MOL) metal resistor temperature sensors for localized temperature sensing of active semiconductor areas in integrated circuits (ICs) are disclosed. One or more metal resistors are fabricated in a MOL layer in the IC adjacent to an active semiconductor area to sense ambient temperature in the adjacent active semiconductor area. Voltage of the metal resistor will change as a function of ambient temperature of the metal resistor, which can be sensed to measure the ambient temperature around devices in the active semiconductor layer adjacent to the metal resistor. By fabricating a metal resistor in the MOL layer, the metal resistor can be localized adjacent and close to semiconductor devices to more accurately sense ambient temperature of the semiconductor devices. The same fabrication processes used to create contacts in the MOL layer can be used to fabricate the metal resistor.

14 Claims, 14 Drawing Sheets

(51) Int. Cl.

| | | |
|---|---|---|
| *H01L 21/3213* | (2006.01) | |
| *H01L 21/768* | (2006.01) | |
| *H01L 21/66* | (2006.01) | |
| *H01L 23/528* | (2006.01) | |
| *H01L 49/02* | (2006.01) | |
| *G01K 7/18* | (2006.01) | |
| *H01L 23/34* | (2006.01) | |
| *H01L 23/522* | (2006.01) | |
| *H01L 27/06* | (2006.01) | |

(52) U.S. Cl.
CPC .. *H01L 21/32139* (2013.01); *H01L 21/76895* (2013.01); *H01L 22/34* (2013.01); *H01L 23/34* (2013.01); *H01L 23/528* (2013.01); *H01L 23/5228* (2013.01); *H01L 28/24* (2013.01); *H01L 27/0629* (2013.01)

(58) Field of Classification Search
USPC .................................................. 374/178, 185
See application file for complete search history.

(56) References Cited

U.S. PATENT DOCUMENTS

| | | | | |
|---|---|---|---|---|
| 7,187,961 | B2* | 3/2007 | Yamashita | A61B 5/0002 |
| | | | | 128/903 |
| 8,785,931 | B2 | 7/2014 | Kinouchi et al. | |
| 9,651,431 | B2* | 5/2017 | Kim | G01K 3/06 |
| 2004/0188795 | A1* | 9/2004 | Ohkubo | G01K 7/01 |
| | | | | 257/467 |
| 2009/0305499 | A1 | 12/2009 | Gambino et al. | |
| 2010/0150202 | A1* | 6/2010 | Asano | G01K 7/01 |
| | | | | 374/44 |
| 2012/0163413 | A1* | 6/2012 | Kim | G01K 7/01 |
| | | | | 374/152 |
| 2013/0334646 | A1* | 12/2013 | Chen | G01K 7/183 |
| | | | | 257/467 |
| 2014/0247859 | A1* | 9/2014 | Kim | G01K 3/06 |
| | | | | 374/178 |
| 2014/0368264 | A1 | 12/2014 | Horng et al. | |
| 2014/0376595 | A1 | 12/2014 | Daley et al. | |
| 2015/0035568 | A1 | 2/2015 | Peng et al. | |
| 2016/0290873 | A1* | 10/2016 | Horng | G01R 31/2874 |
| 2018/0247919 | A1* | 8/2018 | Lin | H01L 25/0657 |

OTHER PUBLICATIONS

Kim, Seong-Jin et al., "High Accuracy Remote Temperature Sensor Based on BJT Devices in 0.13-μm CMOS," 2014, International Symposium on Integrated Circuits (ISIC), Dec. 10-12, 2014, IEEE, pp. 408-411.

Souri, Kianoush, "An Energy-Efficient, Resistor-Based Smart Temperature Sensor," Master of Science Thesis, Delft University of Technology, Aug. 29, 2013, 93 pages.

Wang, Bo et al., "A sub-1V BJT-based CMOS temperature sensor from −55° C. to 125° C.," ISCAS 2012, IEEE, pp. 3114-3117.

Second Written Opinion for PCT/US2017/043897, dated Jul. 18, 2018, 6 pages.

International Preliminary Report on Patentability for PCT/US2017/043897, dated Oct. 31, 2018, 21 pages.

* cited by examiner

MIDDLE-OF-LINE (MOL) METAL RESISTOR TEMPERATURE SENSORS FOR LOCALIZED TEMPERATURE SENSING OF ACTIVE SEMICONDUCTOR AREAS IN INTEGRATED CIRCUITS (ICS)

BACKGROUND

I. Field of the Disclosure

The technology of the disclosure relates generally to temperature sensing in an integrated circuit (IC), and more particularly to providing on-chip temperature sensors in an IC chip for sensing the temperature of semiconductor devices in the IC chip.

II. Background

Accurate measurement of ambient temperature is important in many applications such as instruments, controllers, and monitoring systems. Temperature is also important for the performance of circuits. For example, one way to increase the performance of circuits in an integrated circuit (IC) is to increase supply voltage. However, as supply voltage increases, temperature within the IC may also increase. Rising temperatures in an IC may eventually cause carrier mobility degradation, and thus actually slow down operation of the IC, increase resistivity, and/or cause circuit failures. The problem has become especially critical as voltage scaling has slowed down and the number of active components per unit area in an IC has increased. Thus, it is desired to measure temperature in an IC to control thermal dissipation. Thus, as an example, the measured temperature can be used as a factor to control voltage scaling of supply voltages to increase supply voltages to increase performance when desired or possible, but also decrease supply voltages when temperature exceeds desired limits.

Smart temperature sensors can be fabricated on-chip in standard complementary metal oxide semiconductor (CMOS) technology within an IC to measure temperatures in the IC. On-chip temperature sensors can offer digitized temperature values to other circuits in the IC at low cost and small form factor. For example, the sensed temperature may be provided as an input to a voltage scaling circuit that controls scaling of a supply voltage based on temperature. In this manner, adaptive voltage scaling can be performed based on temperature to increase supply voltage to increase performance when there is temperature margin, and decrease supply voltage to decrease performance when the temperature exceeds a desired temperature value. This can also protect circuits and components in the IC from being damaged due to excessively high temperatures.

Conventional on-chip temperature sensors use vertically formed parasitic bipolar junction transistors (BJTs), because a base-emitter voltage (Vbe) potential of BJTs in forward-active regions is inversely proportional to temperature. This is referred to as complementary-to-absolute-temperature (CTAT). There are deficiencies in BJT temperature sensors that have become increasingly problematic. For example, the relationship between the temperature and the power level of a BJT temperature sensor becomes increasingly non-linear as power densities increase in ICs. However at the same time, precision in temperature measurement has become increasingly important in thermal management of ICs. Further, BJT temperature sensors consume a large area that makes it more difficult to scale down the size of BJTs. Also, it may be important to isolate BJT temperature sensors from other operational transistors in an IC to avoid parasitic capacitances and noise from the BJTs affecting metal oxide semiconductor (MOS) field-effect transistor (FET) (MOSFET) operation. For these reasons, it may only be possible to locate a BJT temperature sensor within 5-10 micrometers (μm) away from an area of interest in the IC. However, it may be important to locate temperature sensing devices much closer to specific areas and devices of interest for temperature monitoring, because certain localized areas may be known to be hot spots that have a disproportionately high temperature as compared to other areas in the IC.

SUMMARY OF THE DISCLOSURE

Aspects disclosed herein include middle-of-line (MOL) metal resistor temperature sensors for localized temperature sensing of active semiconductor areas in integrated circuits (ICs). In this regard, in certain aspects disclosed herein, one or more metal resistors are fabricated in a MOL layer of an IC to sense ambient temperature in the IC. The MOL layer is formed above and adjacent to an active semiconductor area in a front-end-of-line (FEOL) portion of the IC that includes devices, such as MOS field-effect transistors (MOSFETs) for example. Resistance of the metal resistor changes as a function of an ambient temperature in the active semiconductor area, because heat generated by the devices in the active semiconductor area cause atoms in the MOL layer to vibrate, thus freeing captive electrons to become carriers of current through the metal resistor. Thus, the voltage of the metal resistor will change as a function of ambient temperature of the metal resistor, which can be sensed to measure the ambient temperature around devices in the active semiconductor layer adjacent to the metal resistor. The metal resistor can also be coupled through contacts formed in the MOL layer to interconnect lines in interconnect layer(s) to be coupled to a voltage source and on-chip temperature sensing circuit in the IC configured to sense temperature as a function of the voltage across the metal resistor. A higher power-consuming current source is not required to sense temperature in the MOL metal resistor temperature sensor like provided in BJT temperature sensors to measure temperature. The sensed temperature may be used to control operations in the IC that are affected by temperature, such as voltage supply scaling as an example.

Thus, by fabricating a metal resistor in the MOL layer in the IC, the metal resistor can advantageously be localized adjacent and very close to semiconductor devices, such as transistors, to more accurately sense temperature around the semiconductor devices. This is opposed to BJT temperature sensors that are located farther away in the IC (e.g., 10 times farther away) from complementary MOS (CMOS) devices due to the size and area constraints of BJTs. Also, by providing the metal resistor in the MOL layer, the same fabrication processes used to create contacts in the MOL layer can also be used to fabricate the metal resistor in the MOL layer. Further, because the MOL layer is already provided in the IC to provide contacts between the semiconductor devices in the active semiconductor layer and the interconnect layers, additional area may not be required to provide the metal resistors in the IC.

In this regard, in one exemplary aspect, a MOL temperature sensor for an IC is provided. The MOL temperature sensor comprises an active semiconductor layer. The MOL temperature sensor also comprises a metal resistor having a resistance and comprising a first metal material disposed in an MOL layer disposed above the active semiconductor layer. The MOL temperature sensor also comprises a first contact disposed above the metal resistor in the MOL layer, the first contact electrically coupled to a first contact area of the metal resistor. The MOL temperature sensor also comprises a second contact disposed above the metal resistor in the MOL layer, the second contact electrically coupled to a second contact area of the metal resistor, wherein the metal resistor has a resistance between the first contact area and the second contact area. The MOL temperature sensor also comprises a first interconnect disposed in a first interconnect layer above the MOL layer in the active semiconductor layer, the first interconnect layer electrically coupled to the first contact to electrically couple the first interconnect to the first contact area of the metal resistor. The MOL temperature sensor also comprises a second interconnect disposed in a second interconnect layer above the MOL layer in the active semiconductor layer, the second interconnect layer electrically coupled to the second contact to electrically couple the second interconnect to the second contact area of the metal resistor In another exemplary aspect, a MOL metal resistor temperature sensor is provided. The MOL metal resistor temperature sensor comprises a means of forming an active semiconductor layer. The MOL metal resistor temperature sensor also comprises a means for forming a MOL layer above the means for providing the active semiconductor layer. The MOL metal resistor temperature sensor also comprises a means for forming a resistance disposed in the means for forming the MOL layer, the means for forming the resistance further comprising a means for providing the resistance between a first means for providing a first contact area and a second means for providing a second contact area. The MOL metal resistor temperature sensor also comprises a first contacting means disposed above the means for providing the resistance for electrically coupling to the first means for providing the first contact area. The MOL metal resistor temperature sensor also comprises a second contacting means disposed above the means for providing the resistance for electrically coupling to the second means for providing the second contact area. The MOL metal resistor temperature sensor also comprises a first means for electrically coupling to the first contacting means, the first means for electrically coupling disposed in a first interconnect layer above the means for forming the MOL layer. The MOL metal resistor temperature sensor also comprises a second means for electrically coupling to the second contacting means, the second means for electrically coupling disposed in a second interconnect layer above the means for forming the MOL layer.

In another exemplary aspect, a method of sensing temperature in a semiconductor die for an IC is provided. The method comprises forming a substrate. The method also comprises forming an active semiconductor layer above the substrate. The method also comprises forming at least one semiconductor device in the active semiconductor layer. The method also comprises forming a middle-of-line (MOL) layer above the active semiconductor layer. The method also comprises forming a MOL layer above the active semiconductor layer, comprising forming a metal resistor having a resistance and comprising a first metal material in the MOL layer. The first metal resistor comprises a first contact area and a second contact area and has a resistance between the first contact area and the second contact area. The method also comprises forming a first contact above the metal resistor in the MOL layer and in contact with the first contact area of the metal resistor. The method also comprises forming a second contact above the metal resistor in the MOL layer and in contact with the second contact area of the metal resistor. The method also comprises forming at least one interconnect layer above the MOL layer. The method also comprises forming a first interconnect in the at least one interconnect layer electrically coupled to the first contact, to electrically couple the first interconnect to the first contact area of the metal resistor. The method also comprises forming a second interconnect in the at least one interconnect layer electrically coupled to the second contact, to electrically couple the second interconnect to the second contact area of the metal resistor.

In another exemplary aspect, an IC is provided. The IC comprises an active semiconductor layer. The IC also comprises a MOL layer disposed above the active semiconductor layer. The IC also comprises a MOL temperature sensor comprising a metal resistor disposed in the MOL layer, the metal resistor having a resistance that changes as a function of a change in an ambient temperature of the metal resistor. The IC also comprises a voltage source electrical coupled to the metal resistor. The voltage source is configured to apply a first voltage to the metal resistor. The IC also comprises a voltage detector circuit configured to sense a second voltage as a function of the ambient temperature of the metal resistor when the first voltage is applied to the metal resistor. The IC also comprises a measurement circuit configured to measure the ambient temperature of the metal resistor based on a voltage level of the sensed voltage, and generate a temperature signal on an output node representing an ambient temperature value of the metal resistor.

DETAILED DESCRIPTION

Figure 1:
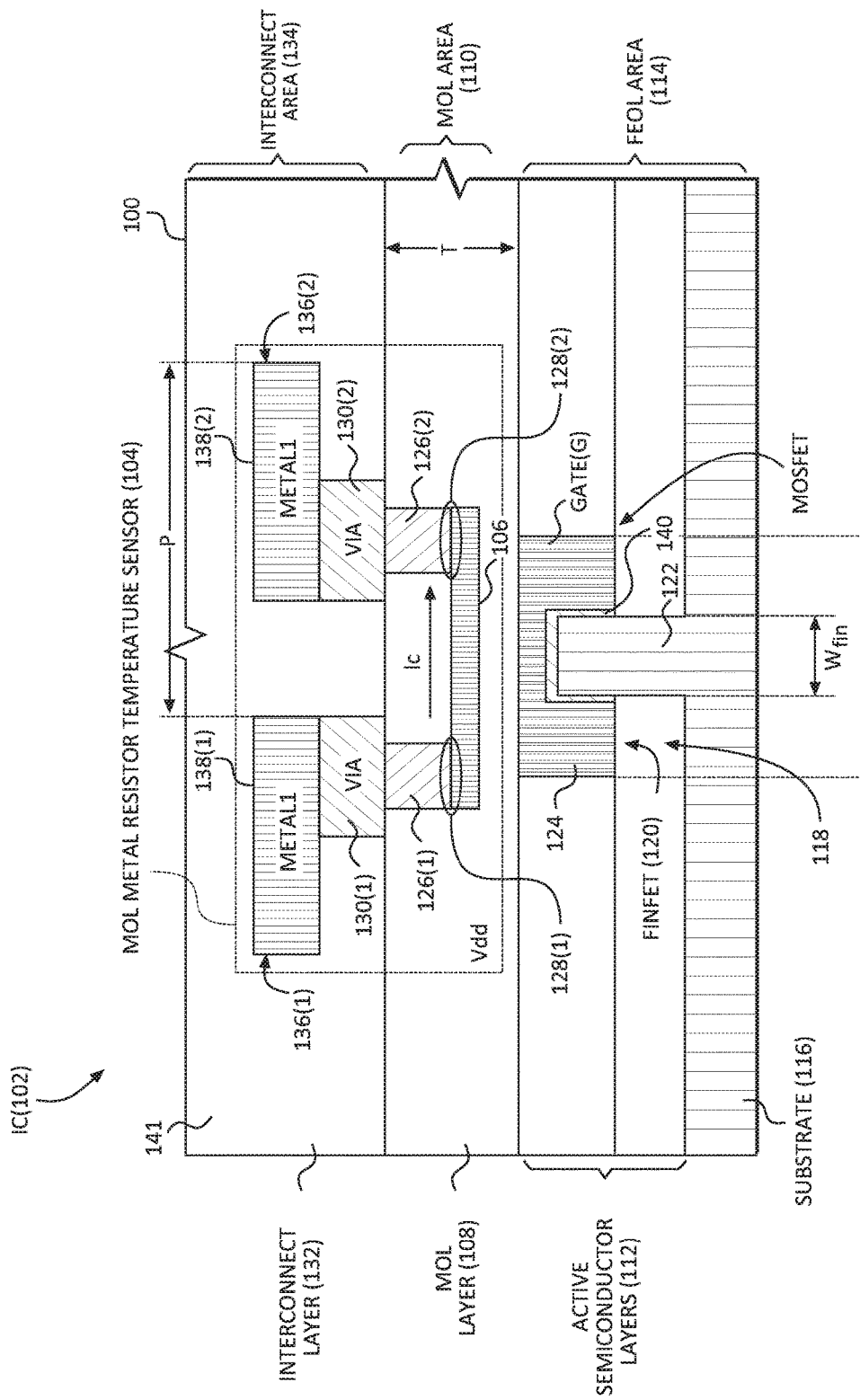
FIG. 1 is a diagram illustrating a cross-sectional, side view of an integrated circuit (IC) that includes a middle-of-line (MOL) metal resistor temperature sensor fabricated in an MOL layer adjacent to an active semiconductor layer in the IC for localized sensing of ambient temperature of a metal resistor and the active semiconductor layer adjacent to the metal resistor as a function of a change in a resistance in the metal resistor.

With reference now to the drawing figures, several exemplary aspects of the present disclosure are described. The word "exemplary" is used herein to mean "serving as an example, instance, or illustration." Any aspect described herein as "exemplary" is not necessarily to be construed as preferred or advantageous over other aspects.

In another exemplary aspect, a method of sensing temperature in a semiconductor die for an integrated circuit (IC) is provided. The method comprises forming a substrate. The method also comprises forming an active semiconductor layer above the substrate. The method also comprises forming at least one semiconductor device in the active semiconductor layer. The method also comprises forming a middle-of-line (MOL) layer above the active semiconductor layer. The method also comprises forming a metal resistor having a resistance and comprising a first metal material in the MOL layer, the first metal resistor comprising a first contact area and a second contact area and having a resistance between the first contact area and the second contact area. The method also comprises forming a first contact above the metal resistor in the MOL layer and in contact with the first contact area of the metal resistor. The method also comprises forming a second contact above the metal resistor in the MOL layer and in contact with the second contact area of the metal resistor. The method also comprises forming at least one interconnect layer above the MOL layer. The method also comprises forming a first interconnect in the at least one interconnect layer electrically coupled to the first contact, to electrical couple the second interconnect to the first contact area of the metal resistor. The method also comprises forming a second interconnect in the at least one interconnect layer electrically coupled to the second contact, to electrical couple the second interconnect to the second contact area of the metal resistor.

In another exemplary aspect, an IC. The IC comprises an active semiconductor layer. The IC also comprises a MOL layer disposed above the active semiconductor layer. The IC also comprises a MOL temperature sensor comprising a metal resistor disposed in the MOL layer, the metal resistor having a resistance that changes as function of change in ambient temperature of the metal resistor. The IC also comprises a voltage source electrical coupled to the metal resistor, the voltage source configured to apply a voltage to metal resistor. The IC also comprises a voltage detector circuit configured to sense a voltage of the metal resistor generated in response to the voltage provided to the metal resistor and the ambient temperature of the metal resistor. The IC also comprises a measurement circuit configured to measure ambient temperature of the metal resistor based on a voltage level of the sensed voltage, and generate a temperature signal on an output node representing the ambient temperature value of the metal resistor.

In this regard, FIG. 1 is a diagram illustrating a cross-sectional, side view of a semiconductor die 100 for an IC 102 that includes a MOL metal resistor temperature sensor 104. The MOL metal resistor temperature sensor 104 is provided on-chip in the IC 102 in this example. The MOL metal resistor temperature sensor 104 includes a metal resistor 106 that is fabricated from a metal material provided in a MOL layer 108 in a MOL area 110 of the semiconductor die 100. The metal resistor 106 has a resistance based on the metal material and the sizing of the metal resistor 106. The MOL layer 108 is formed above and adjacent to one or more active semiconductor layers 112 in a front-end-of-line (FEOL) area 114 of the semiconductor die 100 disposed on a substrate 116. The active semiconductor layers 112 include semiconductor devices 118, such as a MOS field-effect transistor (MOSFET) shown in FIG. 1 for example. In this example, the MOSFET is a FinFET 120 that includes a Fin 122 of a width '$W_{fin}$' providing a conductive channel with a gate material 124 disposed adjacent to the Fin 122 to provide a gate (G).

Figure 2:
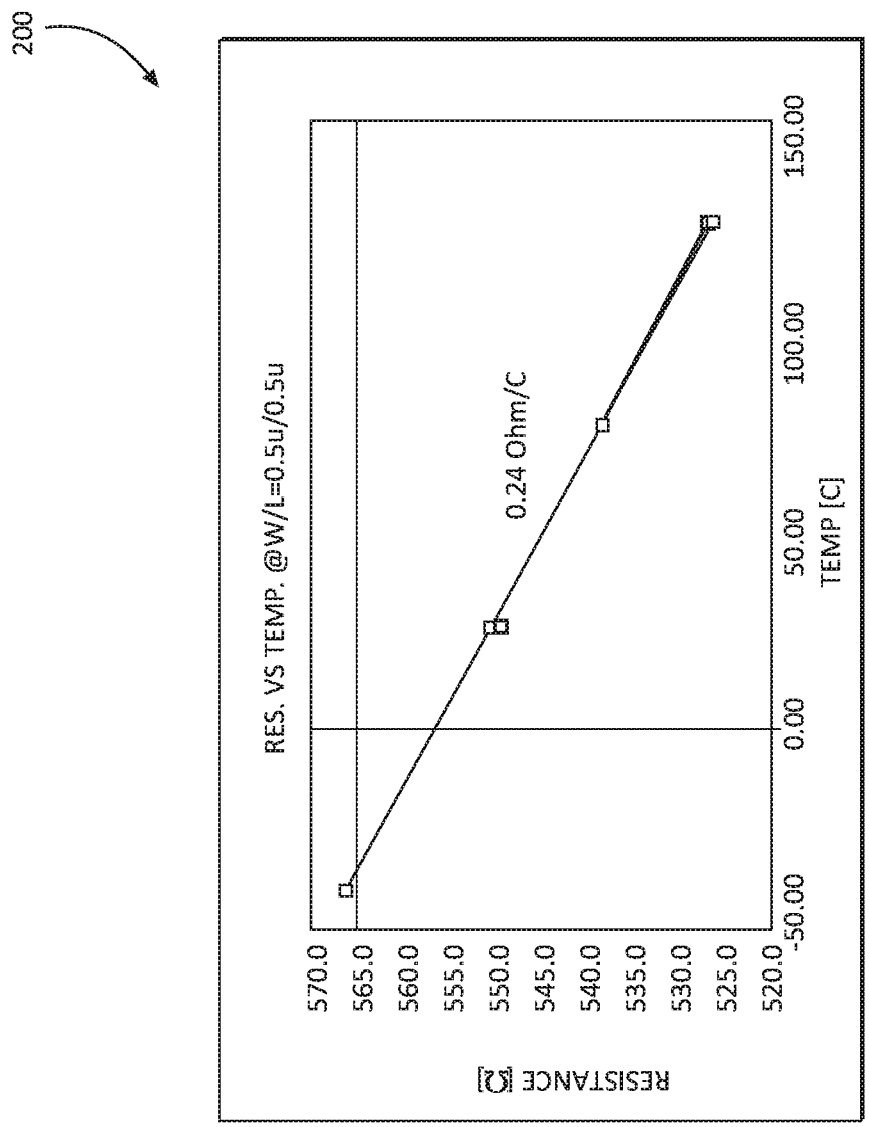
FIG. 2 is a chart illustrating an exemplary relationship between resistance in ohms (Ω) and temperature in Celsius (C) of a metal resistor.

With continuing reference to FIG. 1, the resistance of the metal resistor 106 changes as a function of ambient temperature around the metal resistor 106, because heat generated by the semiconductor devices 118 in the active semiconductor layers 112 adjacent to the MOL layer 108 causes atoms in the MOL layer 108 to vibrate, thus freeing captive electrons to become carriers of current Ic through the metal resistor 106. Thus, when a voltage Vdd from a voltage source is applied to the metal resistor 106, current Ic will flow through the metal resistor 106 as a function of ambient temperature. The change in ambient temperature of the metal resistor 106 can be sensed and measured. For example, FIG. 2 is chart 200 illustrating an exemplary relationship between resistance in ohms ($\Omega$) and temperature in Celsius (C) of the metal resistor 106 in FIG. 1. As shown therein, the resistance of the metal resistor 106 changes approximately 0.24 ohms per degree Celsius for a semiconductor device 118 having a W/L ratio of 0.5 micrometers ($\mu$m)/0.5 $\mu$m, wherein 'W' is the width of the gate (G) and 'L' is the length of the gate (G) of the IC 102.

With reference back to FIG. 1, because the metal resistor 106 is disposed in the MOL layer 108 immediately adjacent to the active semiconductor layers 112 in this example, voltage of the metal resistor 106 can also be used to measure the temperature in the active semiconductor layers 112 and the semiconductor devices 118 disposed therein. Thus, by fabricating the metal resistor 106 in the MOL layer 108, the metal resistor 106 can advantageously be localized adjacent and very close to the semiconductor devices 118 in the active semiconductor layers 112, such as the FinFET 120, to more accurately sense temperature around the semiconductor devices 118. This is opposed to BJT temperature sensors that are located farther away in an IC (e.g., 10 times farther away) from CMOS devices due to the size and area constraints of BJTs. The sensed temperature may be used to control operations in the IC 102 that are affected by temperature, such as voltage supply scaling as an example.

With continuing reference to FIG. 1, to provide connectivity to the MOL metal resistor temperature sensor 104 to be able to direct the voltage Vdd to the metal resistor 106 for sensing ambient temperature of the metal resistor 106, a first contact 126(1) and a second contact 126(2) are provided in the MOL layer 108. The first contact 126(1) is electrically coupled to a first contact area 128(1) of the metal resistor 106. The second contact 126(2) is electrically coupled to a second contact area 128(2) of the metal resistor 106. For example, the first and second contacts 126(1), 126(2) may be conductive contact pads made out of a Tungsten (W) material. In this example, the first and second contacts 126(1), 126(2) physically contact the respective first and second contact areas 128(1), 128(2). The metal resistor 106 has a resistance R between the first contact area 128(1) and the second contact area 128(2). First and second vertical interconnect accesses (vias) 130(1), 130(2) are fabricated in an interconnect layer 132 in an interconnect area 134 of the semiconductor die 100 in aligned contact with the first and second contacts 126(1), 126(2) to provide electrical connectivity between the metal resistor 106 and the interconnect layer 132. For example, the interconnect layer 132 is shown as a metal 1 (M1) layer directly above the MOL layer 108. First and second interconnects 136(1), 136(2) are formed in the interconnect layer 132 above and in contact with the first and second vias 130(1), 130(2). For example, the first and second interconnects 136(1), 136(2) may be metal lines 138(1), 138(2) that were fabricated from a conductive material disposed in trenches formed in a dielectric material 141. In this manner, connectivity to the MOL metal resistor temperature sensor 104 is provided through the metal lines 138(1), 138(2) in this example.

Thus, by fabricating the metal resistor 106 in the MOL layer 108 in the IC 102, the metal resistor 106 can advantageously be localized adjacent and very close to the semiconductor devices 118 in the active semiconductor layers 112, such as transistors, to more accurately sense temperature around the semiconductor devices 118. For example, the MOL layer 108 may have a thickness T of approximately eighteen (18) nanometers (nm) or less, which may be a thickness ratio of approximately 0.26 or less to the thickness of the semiconductor layers 112. This is opposed to BJT temperature sensors for example that are located in an IC farther away (e.g., 10 times farther away) from semiconductor devices due to the size and area constraints of BJTs. Further, because the MOL layer 108 is already provided in the IC 102 to provide contacts between the semiconductor devices 118 in the semiconductor layers 112 and the interconnect layer 132, additional area may not be required to provide the metal resistor 106 in the IC 102. For example, the metal resistor 106 may be approximately a W/L of 0.21 μm/0.21 μm, as opposed to for example, W/L of 3.0 μm/3.0 μm as a typical area required for a BJT temperature sensor. A metal pitch P of the metal lines 138(1), 138(2) in the IC 102 in FIG. 1 is unaffected by the fabrication of the metal resistor 106 in the MOL layer 108 in this example, because the metal resistor 106 can be much smaller than the metal pitch P. Similarly, the alignment of the metal resistor 106 to the gate (G) of the FinFET 120 in the example of FIG. 1 is not critical, because the metal resistor 106 can be much smaller than the gate (G).

The metal resistor 106 can be formed from any conductive material desired. As examples, the metal resistor 106 can be formed from Tungsten Silicide (WSiX), Titanium Nitride (TiN), and Tungsten (W). The metal resistor 106 should have a sufficient resistance to be sensitive to changes in ambient temperature. For example, the resistance of the metal resistor 106 may be at least 400 ohms per W/L μm of the semiconductor devices 118. Thus, small ambient temperature change results will result in a larger resistance change in the metal resistor 106 to provide for accurate temperature sensing. However, small ambient temperature change results may not result in larger resistance changes in the first and second contacts 126(1), 126(2) or the metal lines 138(1), 138(2), because these components are usually fabricated to have lower resistances (e.g., 1.0 ohm per W/L μm) to provide a lower contact and interconnect resistance to avoid impacting performance of the semiconductor devices 118. Also, by disposing the metal resistor 106 in the MOL layer 108, it may be efficient from a fabrication process standpoint to form the metal resistor 106 from the same material as a work function material 140 disposed adjacent to the gate (G) of the FinFET 120.

Figure 3:
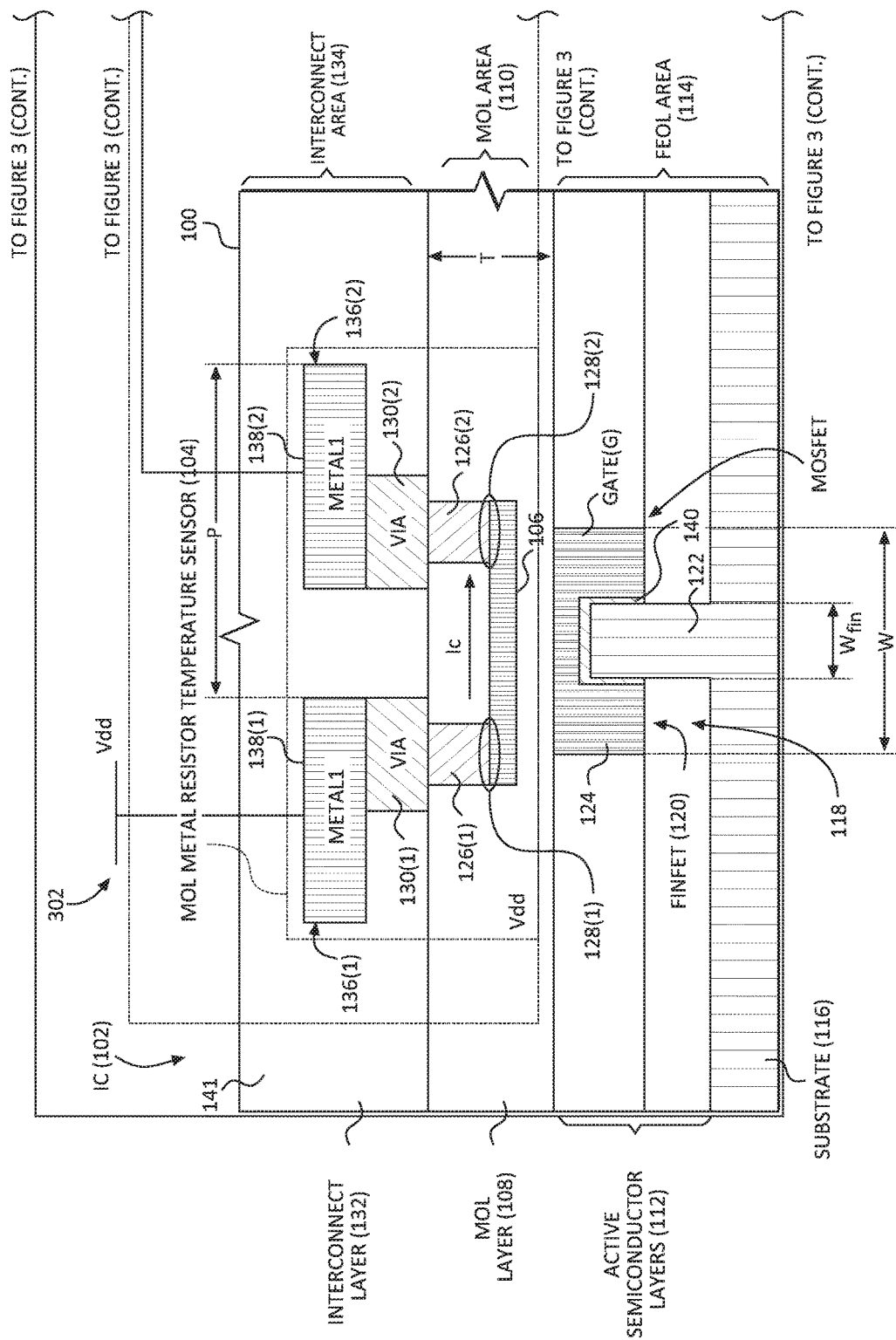
FIG. 3 is a diagram of the MOL metal resistor temperature sensor in FIG. 1 as part of an on-chip temperature sensing system for sensing ambient temperature of the metal resistor and the active semiconductor layer adjacent to the metal resistor.
Figure 3:
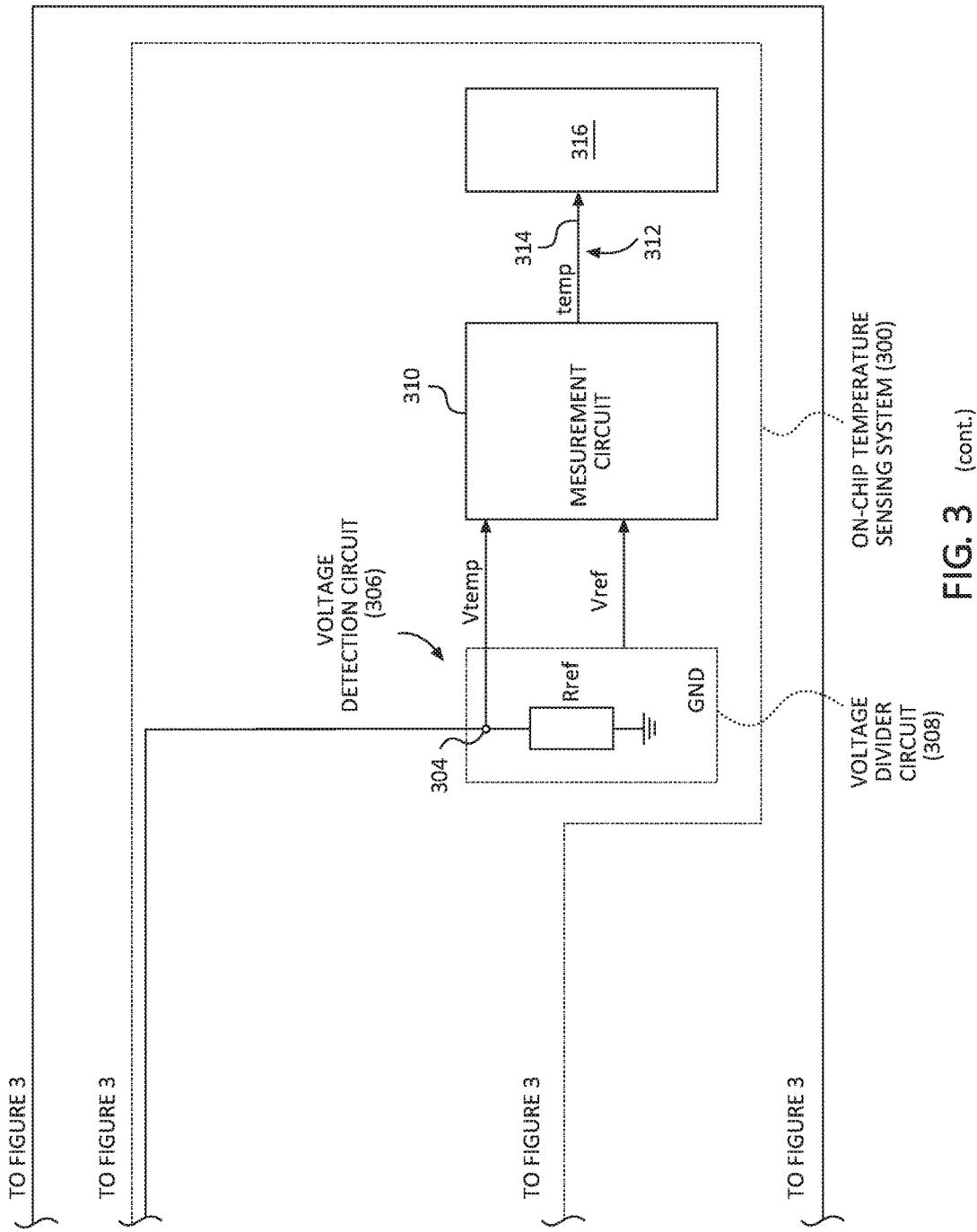
Figure 4:
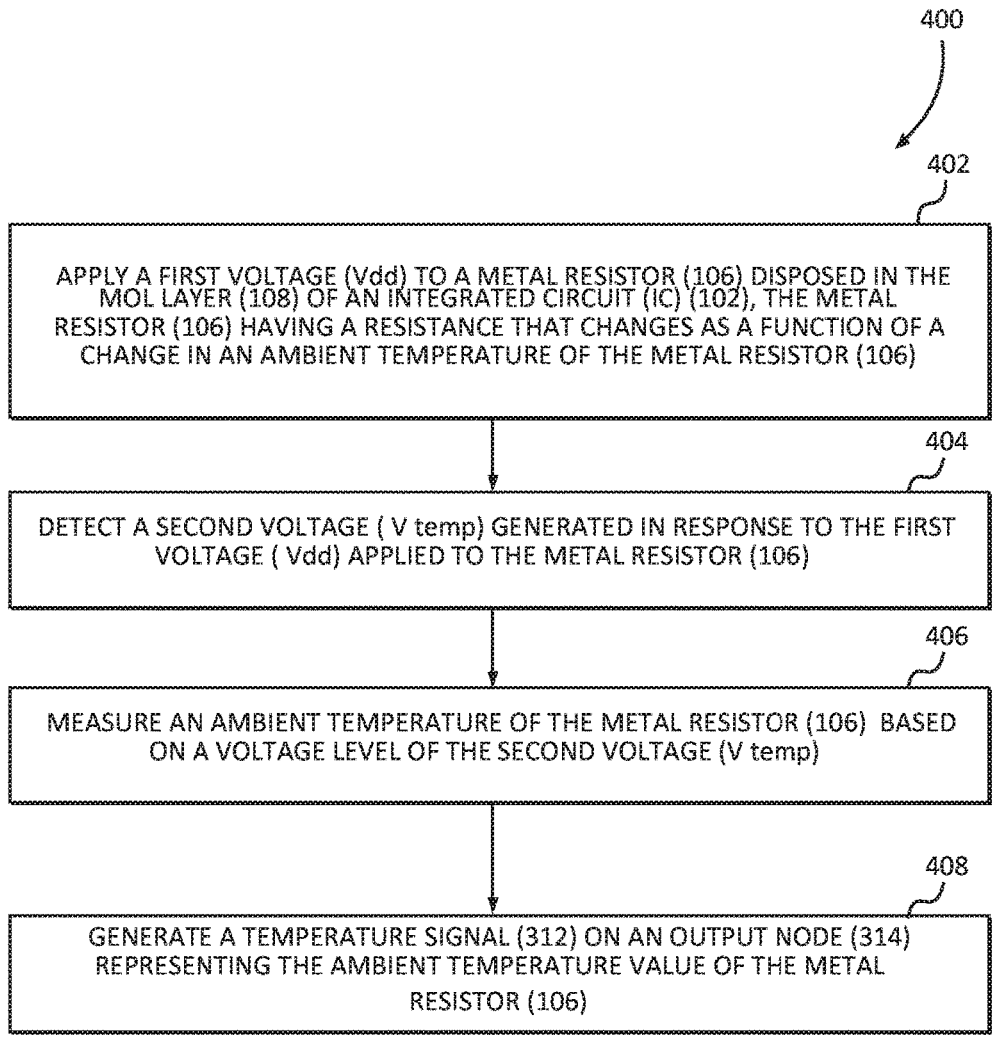
FIG. 4 is a flowchart illustrating an exemplary process of the on-chip temperature sensing system in FIG. 3 for sensing ambient temperature of the metal resistor and the active semiconductor layer adjacent to the metal resistor.

FIG. 3 is a diagram of the MOL metal resistor temperature sensor 104 in FIG. 1 as part of an on-chip temperature sensing system 300 for sensing ambient temperature of the metal resistor 106, and thus the ambient temperature of the active semiconductor layers 112 adjacent to the metal resistor 106 in the MOL layer 108. Common components between FIG. 1 and FIG. 3 are illustrated in FIG. 3 with common element numbers, and thus will not be re-described. FIG. 4 is a flowchart illustrating an exemplary process 400 of the on-chip temperature sensing system 300 in FIG. 3 sensing ambient temperature to the metal resistor 106 and the active semiconductor layers 112 adjacent to the metal resistor 106. FIG. 3 and FIG. 4 will be discussed in conjunction with each other.

In this regard, as shown in FIG. 3, a voltage source 302 is provided that is electrically coupled to the first interconnect 136(1) of the MOL metal resistor temperature sensor 104 to provide a first voltage Vdd to the metal resistor 106 (block 402 in FIG. 4). As previously discussed, the metal resistor 106 has a resistance that changes as a function of the change in ambient temperature of the metal resistor 106. The second interconnect 136(2) is electrically coupled to a voltage divider node 304 in a voltage detector circuit 306 provided in the form of a voltage divider circuit 308 in this example. A reference resistor Rref is also coupled between a ground node (GND) and the voltage divider node 304. Thus, the resistance of the metal resistor 106 that changes as a function of ambient temperature will control the amount of current Ic flowing to the voltage divider node 304, which will divide the first voltage Vdd between the metal resistor 106 and the reference resistor Rref to provide a second voltage Vtemp as Vdd*resistance of reference resistor Rref/ (resistance of metal resistor 106+resistance of reference resistor Rref). The voltage divider circuit 308 is configured to detect the second voltage Vtemp at the voltage divider node 304 generated in response to the first voltage Vdd applied to the metal resistor 106 (block 404 in FIG. 4). The second voltage Vtemp will change as a function of ambient temperature of the metal resistor 106.

With continuing reference to FIG. 3, a measurement circuit 310 can be provided in the on-chip temperature sensing system 300 to receive the second voltage Vtemp and measure the ambient temperature of the metal resistor 106 as a function of a voltage level of the second voltage Vtemp (block 406 in FIG. 4). The measurement circuit 310 is configured to generate a temperature signal (temp) 312 on an output node 314 representing an ambient temperature value of the metal resistor 106 (block 408 in FIG. 4). For example, the measurement circuit 310 could be an analog-to-digital (A/D) circuit configured to generate the temperature signal (temp) 312 as a digital temperature value by converting the second voltage Vtemp into a digital temperature value. As another example, the measurement circuit 310 could be an operational amplifier circuit configured to generate the temperature signal (temp) 312 as a differential analog temperature signal by comparing the second voltage Vtemp to a reference voltage or a feedback voltage. The temperature signal (temp) 312 can be directed to other circuits 316 configured to provide operations in the IC 102 based on the ambient temperature, such as voltage scaling for example.

Figure 5:
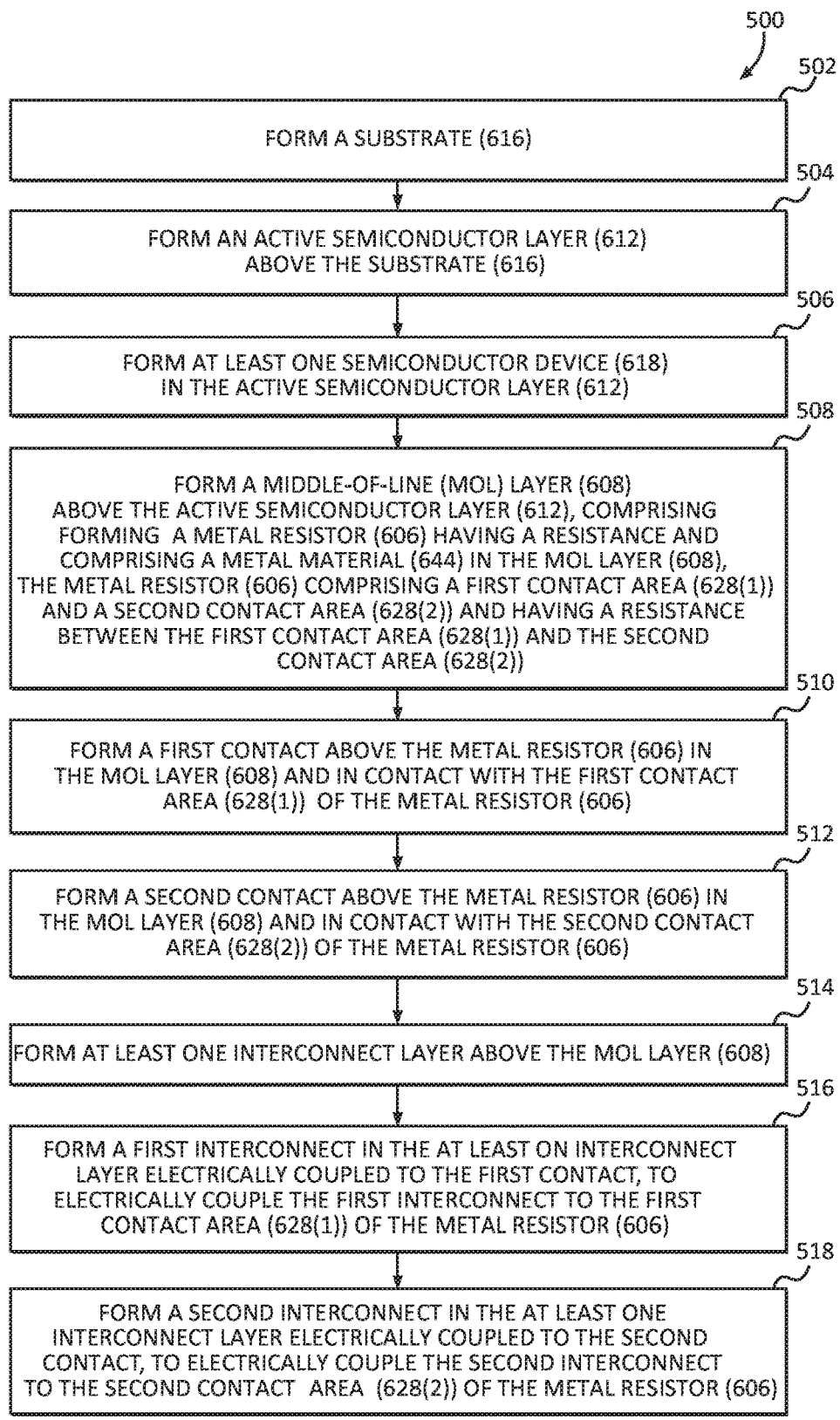
FIG. 5 is a flowchart illustrating an exemplary process of fabricating a MOL metal resistor temperature sensor in an IC, such as the MOL metal resistor temperature sensor in the IC in FIG. 1.

FIG. 5 is a flowchart illustrating an exemplary process 500 of fabricating a MOL metal resistor temperature sensor in an IC, such as the MOL metal resistor temperature sensor 104 in the IC 102 in FIGS. 1 and 3. FIGS. 6A-6F are exemplary process stages 600(1)-600(6) of fabricating a MOL metal resistor temperature sensor in an IC, such as the MOL metal resistor temperature sensor 104 in the IC 102 in FIGS. 1 and 3. The exemplary process 500 in FIG. 5 and the exemplary process stages 600(1)-600(6) to fabricate a MOL metal resistor temperature sensor 604 in FIGS. 6A-6F will now be described.

Figure 6A:
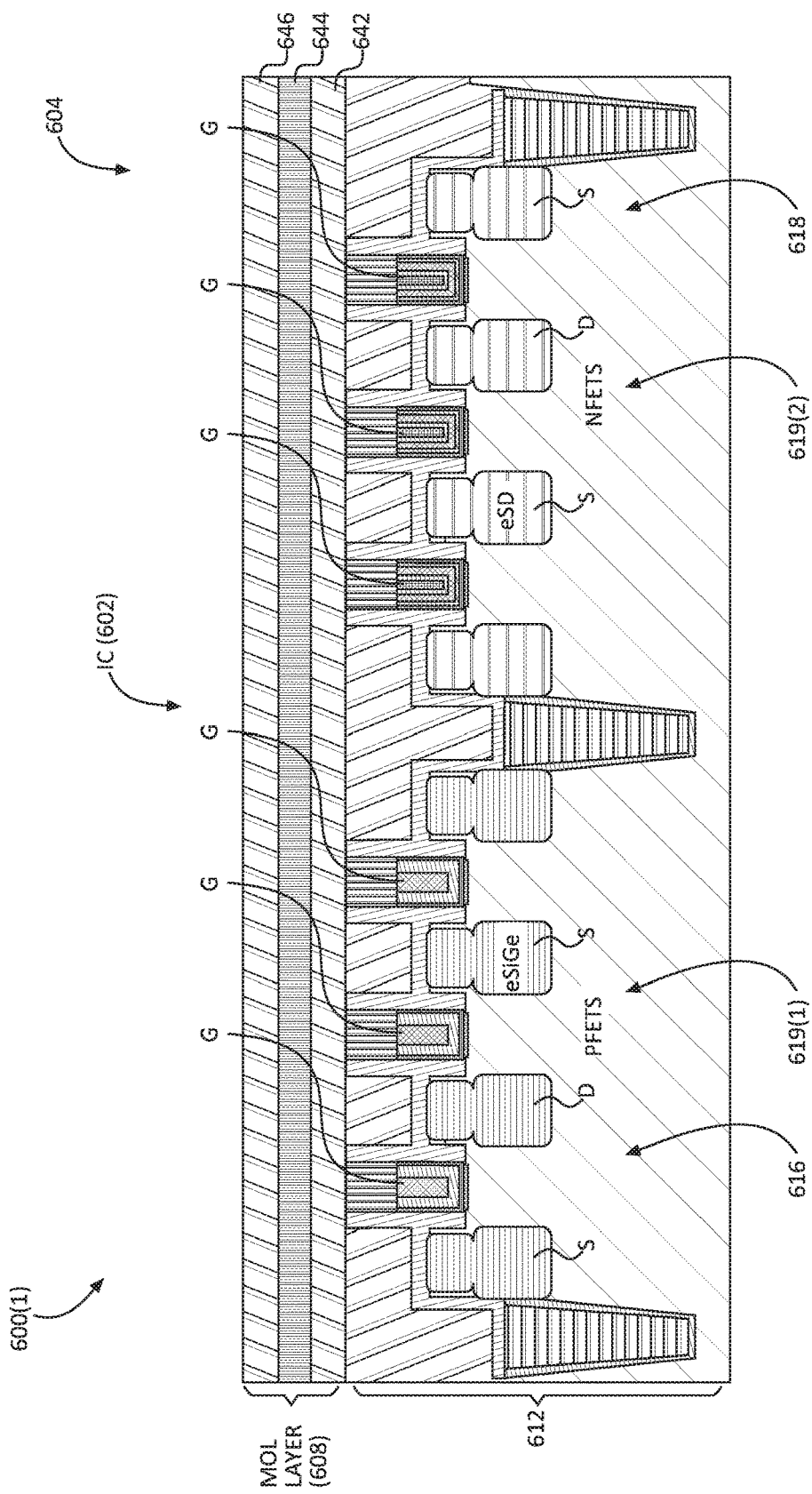
FIGS. 6A-6F are exemplary process stages of fabricating a MOL metal resistor temperature sensor in an IC, such as the MOL metal resistor temperature sensor in the IC in FIG. 1.

As illustrated in processing stage 600(1) in FIG. 6A, a first step of fabricating a MOL metal resistor temperature sensor 604 in an IC 602 is to form a substrate 616 (block 502 in FIG. 5). An active semiconductor layer 612 is formed above the substrate 616 as shown in FIG. 6A (block 504 in FIG. 5). Further, as shown in FIG. 6A, at least one semiconductor device 618 is formed in the active semiconductor layer 612 (block 506 in FIG. 5). In this example, PFETs 619(1) and a NFETs 619(2) are formed in the active semiconductor layer 612. As shown therein, sources (S), drains (D), and gates (G) are formed for the PFETs 619(1) and NFETs 619(2). Next, a MOL layer 608 is formed above the active semiconductor layer 612 (block 508 in FIG. 5). In this example, the middle MOL layer 608 is comprised of a first insulating layer 642 followed by a metal material layer 644, with another second insulating layer 646 disposed on the metal material layer 644. The first and second insulating layers 642, 646 in this example are oxide layers. The metal material layer 644 may be formed of any conductive material that will provide a desired resistance, such as tungsten. As previously discussed, the metal material layer 644 may be formed from the same work function material used to create a gate (G) in the active semiconductor layer 612. The first insulating layer 642 is configured to insulate the MOL layer 608 from the active semiconductor layer 612 and the semiconductor devices 618 fabricated therein. The metal material layer 644 will be processed to form a metal resistor as will be discussed in more detail below.

Figure 6B:
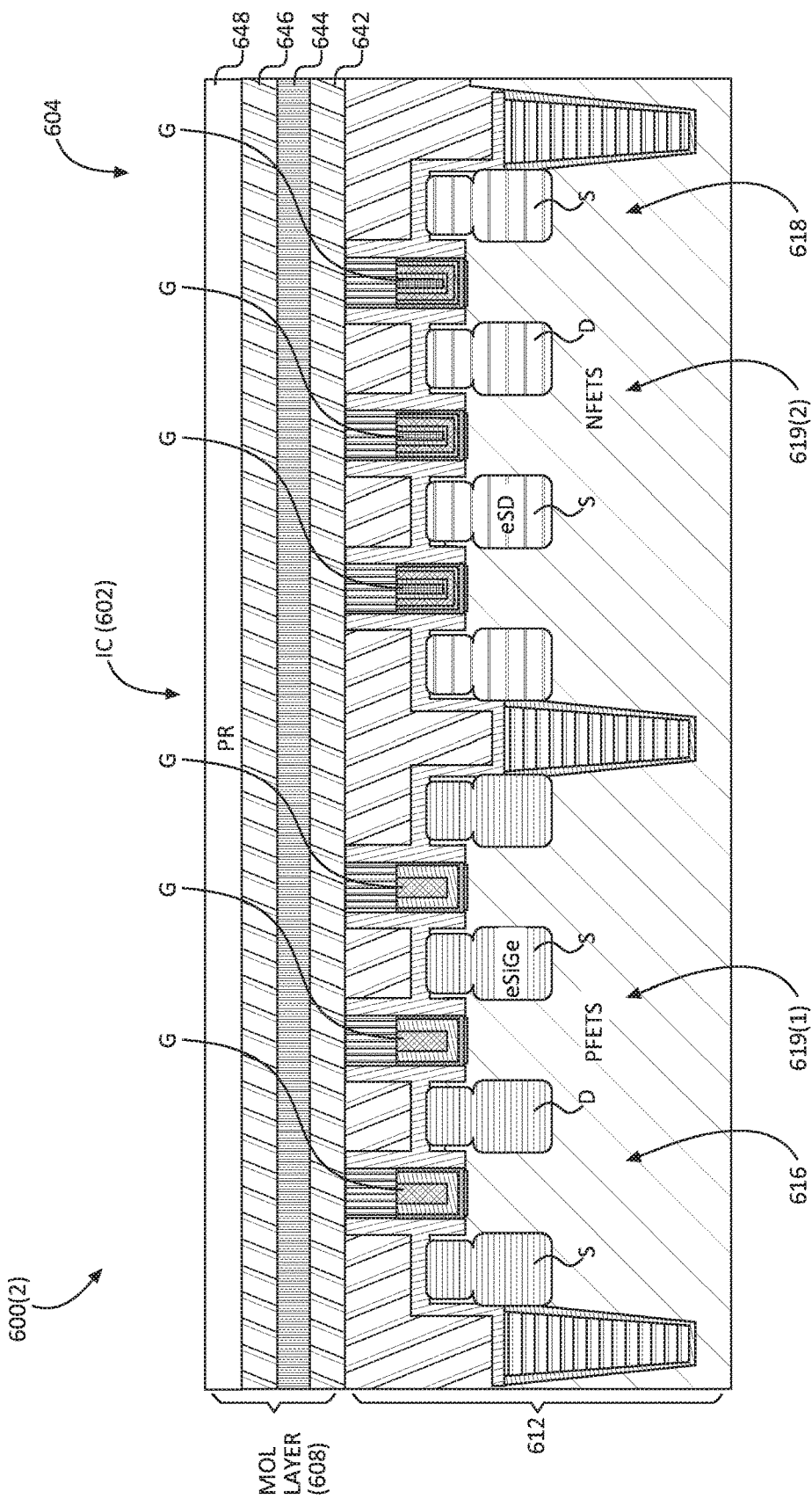
Figure 6C:
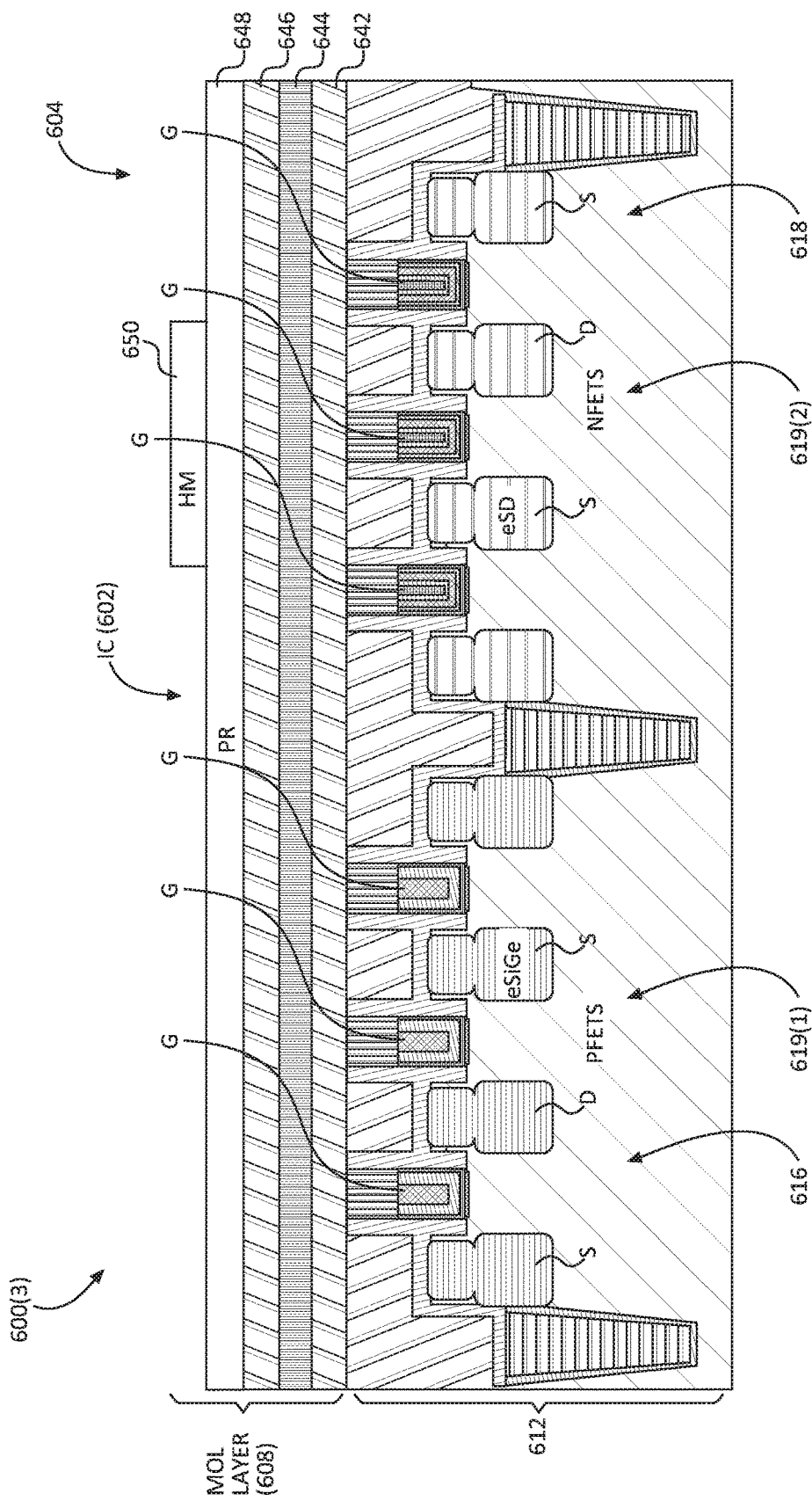
Figure 6D:
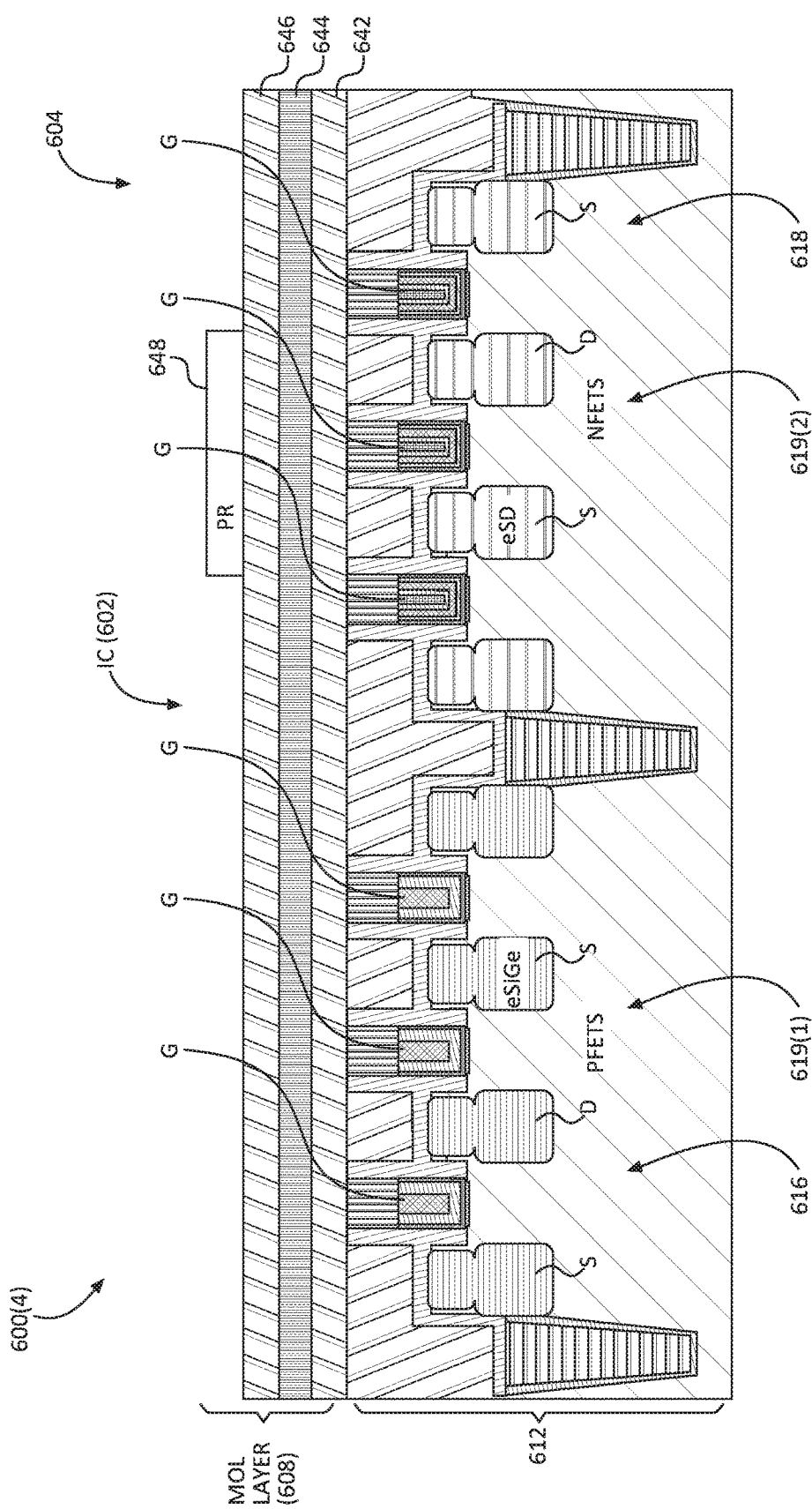
Figure 6E:
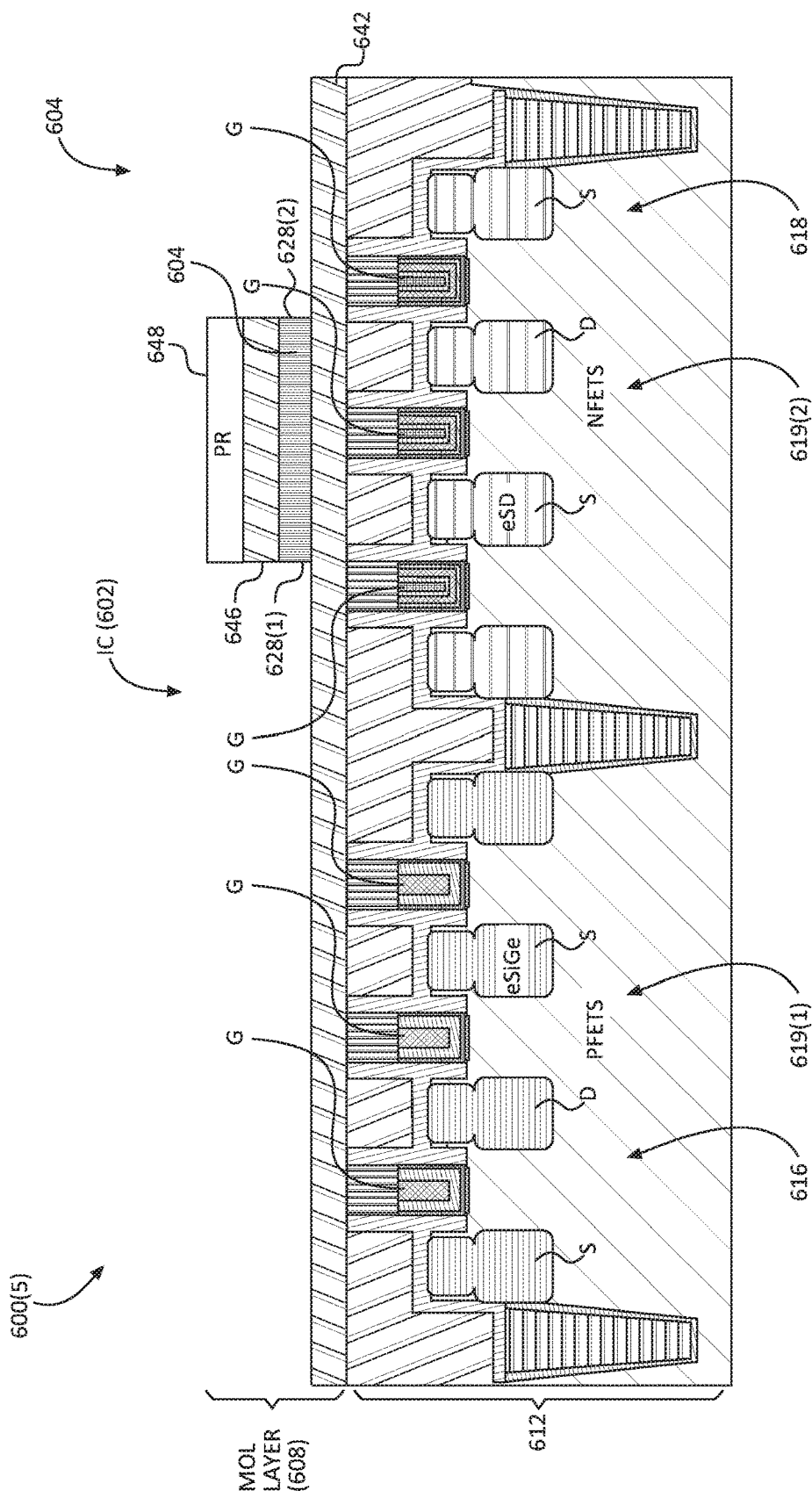

Next, as shown in a second process stage 600(2) in FIG. 6B, to prepare the metal resistor to be formed in the MOL layer 608, a photoresist layer 648 is disposed on top of the MOL layer 608, and more particularly the second insulating layer 646. Next, as shown in the next process stage 600(3) in FIG. 6C, a hard mask 650 is disposed on the photoresist layer 648 to prepare the metal resistor to be formed from the metal material layer 644. The hard mask 650 is sized to be of the desired size of the metal resistor to be formed. As previously discussed, the hard mask 650 may be placed so that the metal resistor is formed from the metal material layer 644 adjacent to a semiconductor device 618 in the active semiconductor layer 612, such as a gate (G) to be affected by the ambient heat generated from the semiconductor device 618. The photoresist layer 648 in the IC 602 is then processed by exposure to light. As shown in the process stage 600(5) in FIG. 6E, the photoresist layer 648, the second insulating layer 646, and the metal material layer 644 are removed except under the area where the hard mask 650 was disposed in process stage 600(4) in FIG. 6D. After the exposure of the photoresist layer 648, the second insulating layer 646 and the metal material layer 644 that are not underneath the hard mask 650 are removed. The remaining metal material layer 644 forms a metal resistor 606 that has a first contact area 628(1) and a second contact area 628(2) for providing electrical contacts to the metal resistor 606 as part of the MOL metal resistor temperature sensor 604. For example, the second insulating layer 646 may be removed by a chemical etch process or other removal process. The metal material layer 644 may be removed by a different chemical etch process or other removal process.

Figure 6F:
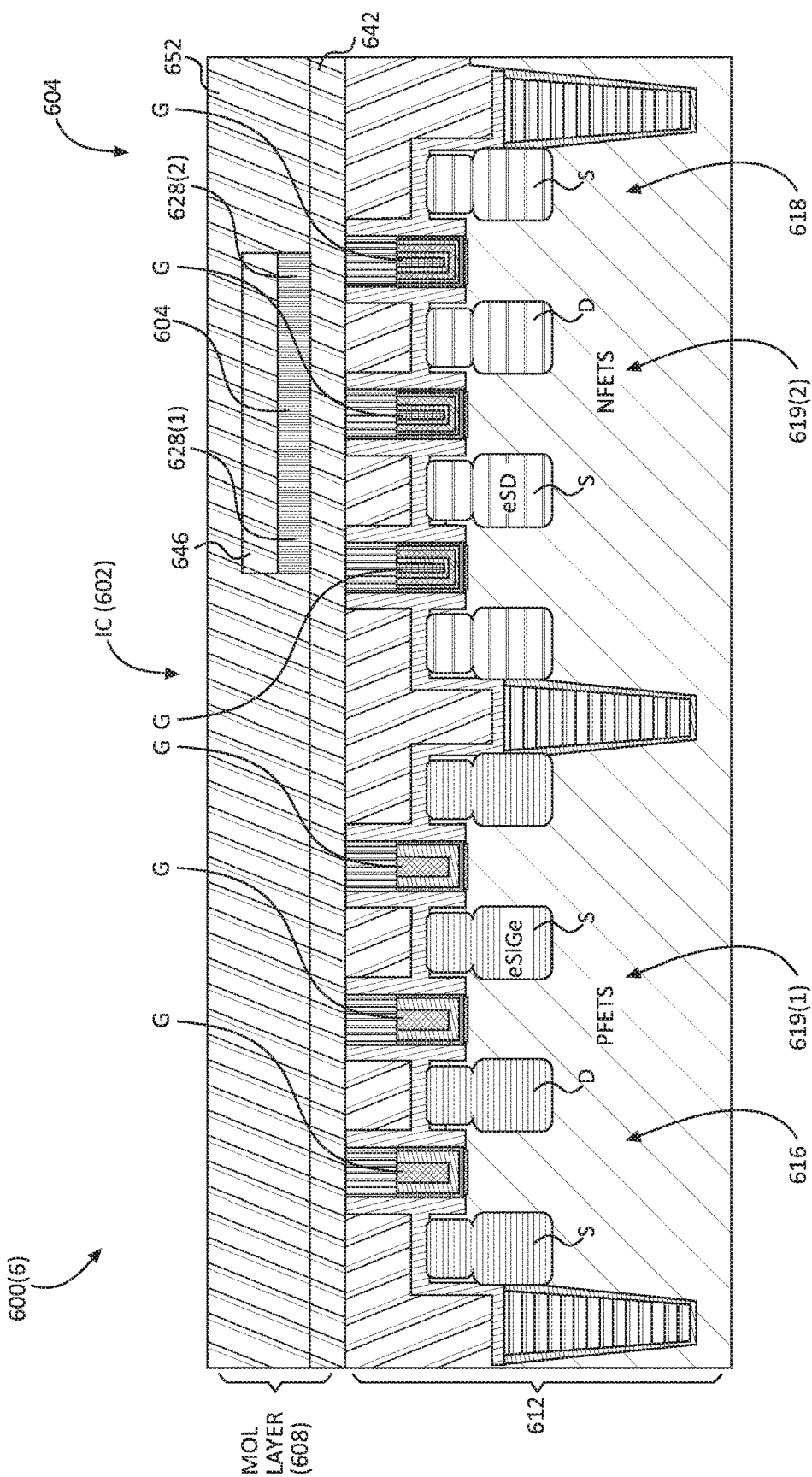

Next, as shown in process stage 600(6) in FIG. 6F, another insulating layer 652, which may be another oxide layer, is disposed over the remaining first insulating layer 642, the metal resistor 606, and the second insulating layer 646 to prepare contacts to be formed in the MOL layer 608. In subsequent processing steps, to continue with fabrication of the MOL metal resistor temperature sensor 604, a first contact is formed above the metal resistor 606 in the MOL layer 608 and is in contact with the first contact area 628(1) (block 510 in FIG. 5). A first contact is also formed above the metal resistor 606 in the MOL layer 608 and in contact with the second contact area 628(2) (block 512 in FIG. 5). At least one interconnect layer is formed above the MOL layer 608 (block 514 in FIG. 5). A first interconnect is formed in the at least one interconnect layer electrically coupled to the first contact, to electrically couple the first interconnect to the first contact area 628(1) of the metal resistor 606 (block 516 in FIG. 5). A second interconnect is formed in the at least one interconnect layer electrically coupled to the second contact, to electrically couple the second interconnect to the second contact area 628(2) of the metal resistor 606 (block 518 in FIG. 5). As previously discussed, vias may be formed in the interconnect layer above the MOL layer 608 to electrically couple contacts connected to the first and second contact areas 628(1), 628(2) of the metal resistor 606 to the first and second interconnects to form a circuit with the metal resistor 606 to form the MOL metal resistor temperature sensor 604.

In other aspects, a MOL metal resistor temperature sensor can include a means of forming an active semiconductor layer. For example, this means may be the active semiconductor layers 112 in the IC 102 in FIG. 1 or 3. The MOL metal resistor temperature sensor can also include a means for forming a MOL layer above the means for providing the active semiconductor layer. For example, the means for forming a MOL layer can be the MOL layer 108 in the IC 102 in FIG. 1 or 3. The MOL metal resistor temperature sensor can also include a means for forming a resistance disposed in the means for forming the MOL layer. For example, the means for forming a resistance may be the metal resistor 106 in FIG. 1 or 3. The means for forming a resistance can include a means for providing the resistance between a first means for providing a first contact area and a second means for providing a second contact area. For examples, the first means for providing a first contact area and the second means for providing a second contact area may be the first and second contact areas 128(1), 128(2) in FIG. 1 or 3, respectively. The MOL metal resistor temperature sensor can also include a first contacting means disposed above the means for providing the resistance for electrically coupling to the first means for providing the first contact area, and a second contacting means disposed above the means for providing the resistance for electrically coupling to the second means for providing the second contact area. For example, these means may be the first and second contacts 126(1), 126(2) in FIG. 1 or 3, respectively. The MOL metal resistor temperature sensor can also include a first means for electrically coupling to the first contacting means, the first means for electrically coupling disposed in a first interconnect layer above the means for forming the MOL layer, and a second means for electrically coupling to the second contacting means, the second means for electrically coupling disposed in a second interconnect layer above the means for forming the MOL layer. For example, these means can be the first and second interconnects 136(1), 136(2) in FIG. 1 or 3, respectively. The first and second interconnects 136(1), 136(2) in FIG. 1 or 3 can be the metal lines 138(1) 138(2), respectively.

MOL metal resistor temperature sensors for localized temperature sensing of active semiconductor areas in integrated circuits (ICs), and according to any of the examples disclosed herein, may be provided in or integrated into any processor-based device. Examples, without limitation, include a set top box, an entertainment unit, a navigation device, a communications device, a fixed location data unit, a mobile location data unit, a mobile phone, a cellular phone, a smart phone, a tablet, a phablet, a computer, a portable computer, a desktop computer, a personal digital assistant (PDA), a monitor, a computer monitor, a television, a tuner, a radio, a satellite radio, a music player, a digital music player, a portable music player, a digital video player, a video player, a digital video disc (DVD) player, a portable digital video player, and an automobile.

Figure 7:
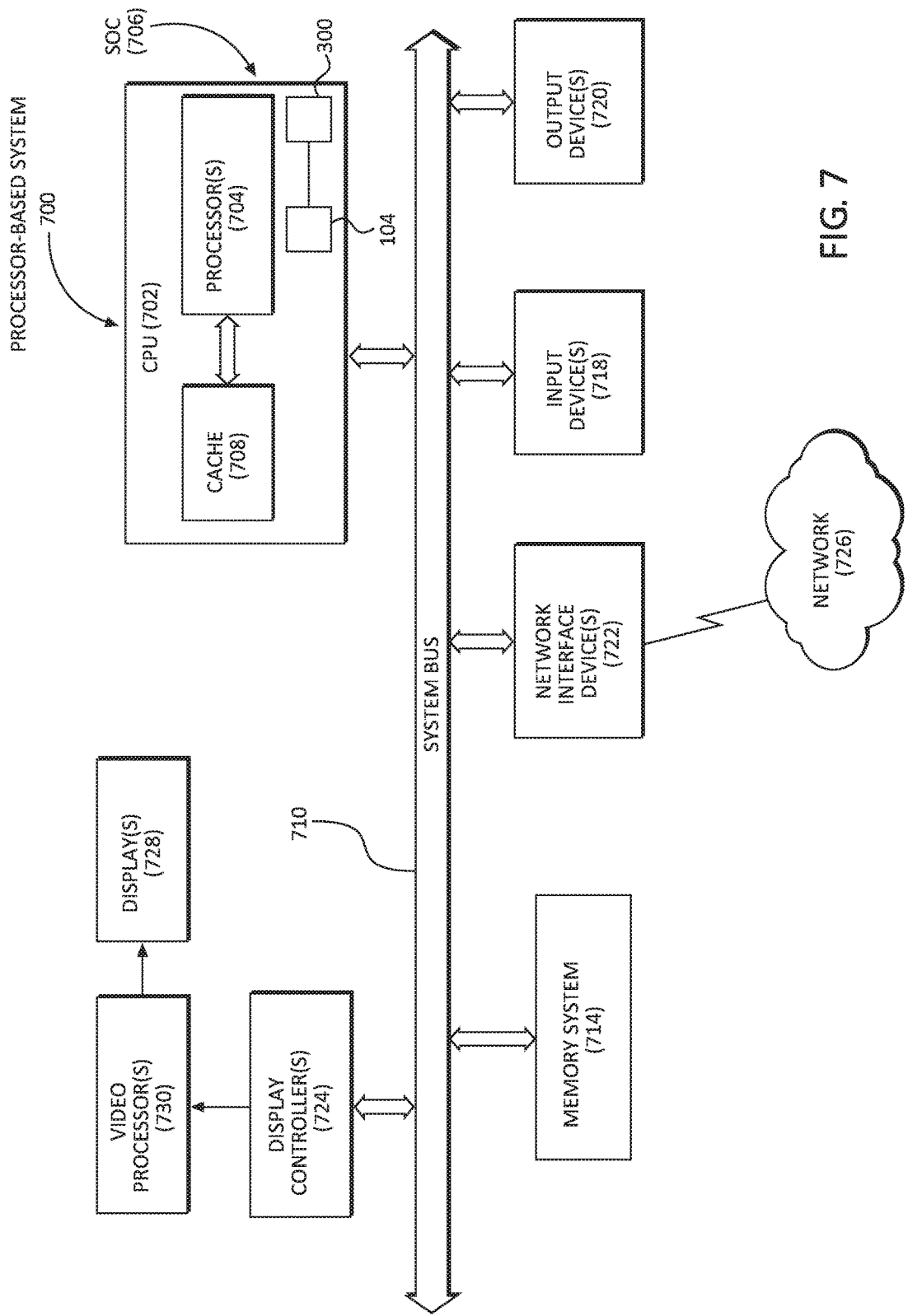
FIG. 7 is a schematic diagram of a generalized representation of an exemplary computer system that can be provided in a system-on-a-chip and include MOL metal resistor temperature sensors and related temperature sensing systems, and according to the examples disclosed herein.

In this regard, FIG. 7 illustrates an example of a processor-based system 700 that includes a CPU 702 that includes one or more processors 704. The processor-based system 700 may be provided as a system-on-a-chip (SoC) 706. The CPU 702 may have a cache memory 708 coupled to the processor(s) 704 for rapid access to temporarily stored data. The CPU 702 may include the MOL metal resistor temperature sensor 104 and on-chip temperature sensing system 300 in FIG. 3 to measure temperature of semiconductor devices in the CPU 702 and to allow control of operations that affect temperature, such as voltage scaling, to be performed based on the measured temperature. The CPU 702 is coupled to a system bus 710 and can intercouple peripheral devices included in the processor-based system 700. The processor(s) 704 in the CPU 702 can communicate with these other devices by exchanging address, control, and data information over the system bus 710. Although not illustrated in FIG. 7, multiple system buses 710 could be provided, wherein each system bus 710 constitutes a different fabric. For example, the CPU 702 can communicate bus transaction requests to a memory in a memory system 714 as an example of a slave device. In this example, the memory controller 712 is configured to provide memory access operations in the memory system 714.

Other devices can be connected to the system bus 710. As illustrated in FIG. 7, these devices can include the memory system 714, one or more input devices 718, one or more output devices 720, one or more network interface devices 722, and one or more display controllers 724, as examples. The input device(s) 718 can include any type of input device, including but not limited to input keys, switches, voice processors, etc. The output device(s) 720 can include any type of output device, including but not limited to audio, video, other visual indicators, etc. The network interface device(s) 722 can be any devices configured to allow exchange of data to and from a network 726. The network 726 can be any type of network, including but not limited to a wired or wireless network, a private or public network, a local area network (LAN), a wireless local area network (WLAN), a wide area network (WAN), a BLUETOOTH™ network, and the Internet. The network interface device(s) 722 can be configured to support any type of communications protocol desired.

The CPU 702 may also be configured to access the display controller(s) 724 over the system bus 710 to control information sent to one or more displays 728. The display(s) 728 can include any type of display, including but not limited to a cathode ray tube (CRT), a liquid crystal display (LCD), a plasma display, etc. The display controller(s) 724 sends information to the display(s) 728 to be displayed via one or more video processors 730, which process the information to be displayed into a format suitable for the display(s) 728.

Figure 8:
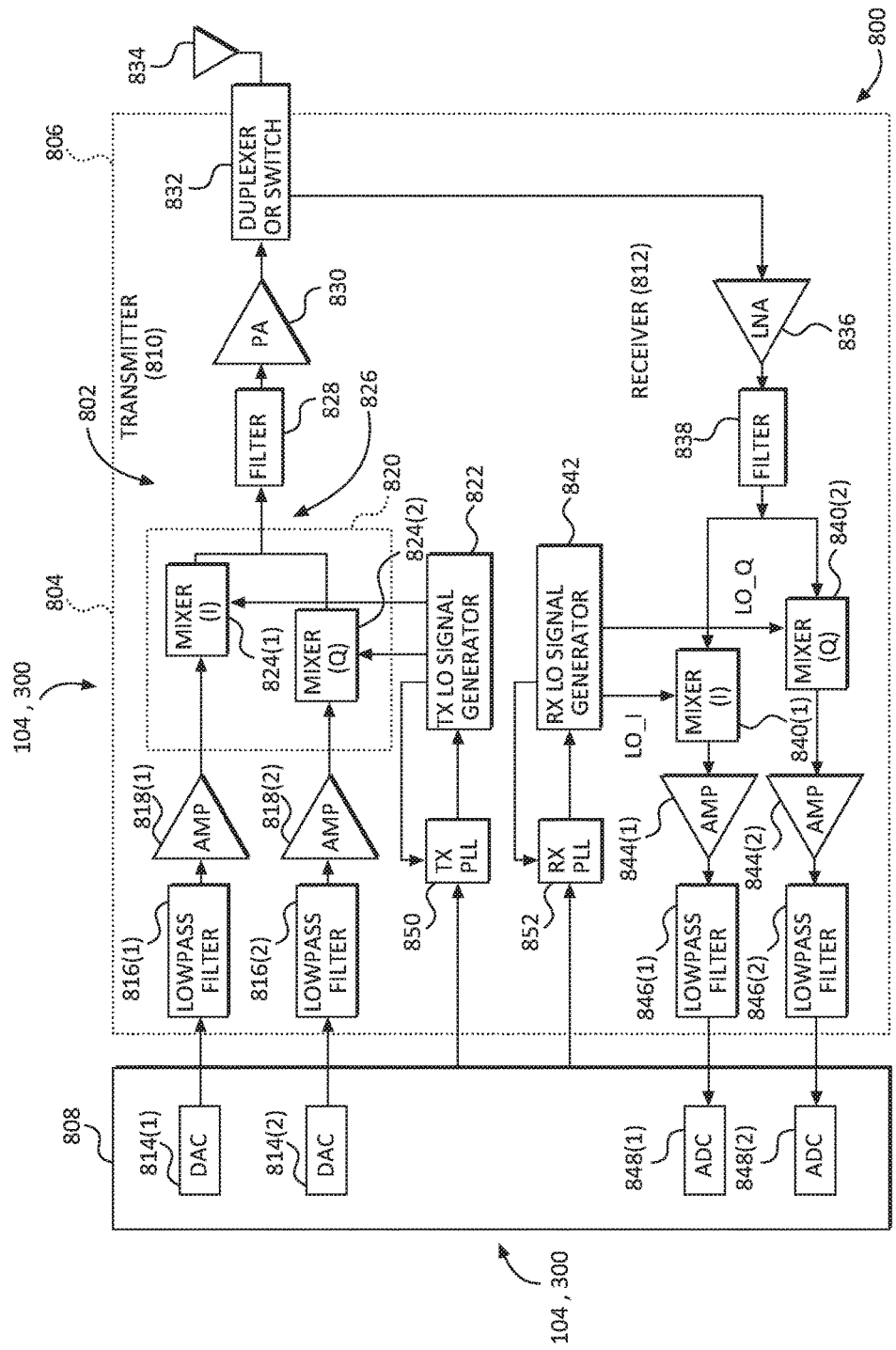
FIG. 8 is a block diagram of an exemplary wireless communications device that includes radio-frequency (RF) components and MOL metal resistor temperature sensors and related temperature sensing systems according to the examples disclosed herein, and according to the exemplary aspects disclosed herein.

FIG. 8 illustrates an example of a wireless communications device 800 which can include RF components in which MOL metal resistor temperature sensors detect temperature changes, including but not limited to the MOL metal resistor temperature sensor 104 and the on-chip temperature sensing system 300 in FIG. 3. In this regard, the wireless communications device 800, may be provided in an integrated circuit (IC) 806. The wireless communications device 800 may include or be provided in any of the above referenced devices, as examples. As shown in FIG. 8, the wireless communications device 800 includes a transceiver 804 and a data processor 808. The IC 806 and/or the data processor 808 may include the MOL metal resistor temperature sensor 104 and on-chip temperature sensing system 300 in FIG. 3 to measure temperature of semiconductor devices in the CPU 702 in FIG. 7 and to allow control of operations that affect temperature, such as attenuation levels, frequency rates as examples to be performed based on the measured temperature. The data processor 808 may include a memory (not shown) to store data and program codes. The transceiver 804 includes a transmitter 810 and a receiver 812 that support bi-directional communication. In general, the wireless communications device 800 may include any number of transmitters and/or receivers for any number of communication systems and frequency bands. All or a portion of the transceiver 804 may be implemented on one or more analog ICs, RF ICs (RFICs), mixed-signal ICs, etc.

A transmitter or a receiver may be implemented with a super-heterodyne architecture or a direct-conversion architecture. In the super-heterodyne architecture, a signal is frequency-converted between RF and baseband in multiple stages, e.g., from RF to an intermediate frequency (IF) in one stage, and then from IF to baseband in another stage for a receiver. In the direct-conversion architecture, a signal is frequency converted between RF and baseband in one stage. The super-heterodyne and direct-conversion architectures may use different circuit blocks and/or have different requirements. In the wireless communications device 800 in FIG. 8, the transmitter 810 and the receiver 812 are implemented with the direct-conversion architecture.

In the transmit path, the data processor 808 processes data to be transmitted and provides I and Q analog output signals to the transmitter 810. In the exemplary wireless communications device 800, the data processor 808 includes digital-to-analog-converters (DACs) 814(1) and 814(2) for converting digital signals generated by the data processor 808 into the I and Q analog output signals, e.g., I and Q output currents, for further processing.

Within the transmitter 810, lowpass filters 816(1), 816(2) filter the I and Q analog output signals, respectively, to remove undesired images caused by the prior digital-to-analog conversion. Amplifiers (AMP) 818(1), 818(2) amplify the signals from the lowpass filters 816(1), 816(2), respectively, and provide I and Q baseband signals. An upconverter 820 upconverts the I and Q baseband signals with I and Q transmit (TX) local oscillator (LO) signals through mixers 824(1), 824(2) from a TX LO signal generator 822 to provide an upconverted signal 826. A filter 828 filters the upconverted signal 826 to remove undesired images caused by the frequency upconversion as well as noise in a receive frequency band. A power amplifier (PA) 830 amplifies the upconverted signal 826 from the filter 828 to obtain the desired output power level and provides a transmit RF signal. The transmit RF signal is routed through a duplexer or switch 832 and transmitted via an antenna 834.

In the receive path, the antenna 834 receives signals transmitted by base stations and provides a received RF signal, which is routed through the duplexer or switch 832 and provided to a low noise amplifier (LNA) 836. The duplexer or switch 832 is designed to operate with a specific RX-to-TX duplexer frequency separation, such that RX signals are isolated from TX signals. The received RF signal is amplified by the LNA 836 and filtered by a filter 838 to obtain a desired RF input signal. Downconversion mixers 840(1), 840(2) mix the output of the filter 838 with I and Q receive (RX) LO signals (i.e., LO_I and LO_Q) from an RX LO signal generator 842 to generate I and Q baseband signals. The I and Q baseband signals are amplified by amplifiers (AMP) 844(1), 844(2) and further filtered by lowpass filters 846(1), 846(2) to obtain I and Q analog input signals, which are provided to the data processor 808. In this example, the data processor 808 includes analog-to-digital-converters (ADCs) 848(1), 848(2) for converting the analog input signals into digital signals to be further processed by the data processor 808.

In the wireless communications device 800 in FIG. 8, the TX LO signal generator 822 generates the I and Q TX LO signals used for frequency upconversion, while the RX LO signal generator 842 generates the I and Q RX LO signals used for frequency downconversion. Each LO signal is a periodic signal with a particular fundamental frequency. A transmit (TX) phase-locked loop (PLL) circuit 850 receives timing information from the data processor 808 and generates a control signal used to adjust the frequency and/or phase of the TX LO signals from the TX LO signal generator 822. Similarly, a receive (RX) phase-locked loop (PLL) circuit 852 receives timing information from the data processor 808 and generates a control signal used to adjust the frequency and/or phase of the RX LO signals from the RX LO signal generator 842.

Those of skill in the art will further appreciate that the various illustrative logical blocks, modules, circuits, and algorithms described in connection with the aspects disclosed herein may be implemented as electronic hardware, instructions stored in memory or in another computer-readable medium and executed by a processor or other processing device, or combinations of both. The master and slave devices described herein may be employed in any circuit, hardware component, integrated circuit (IC), or IC chip, as examples. Memory disclosed herein may be any type and size of memory and may be configured to store any type of information desired. To clearly illustrate this interchangeability, various illustrative components, blocks, modules, circuits, and steps have been described above generally in terms of their functionality. How such functionality is implemented depends upon the particular application, design choices, and/or design constraints imposed on the overall system. Skilled artisans may implement the described functionality in varying ways for each particular application, but such implementation decisions should not be interpreted as causing a departure from the scope of the present disclosure.

The various illustrative logical blocks, modules, and circuits described in connection with the aspects disclosed herein may be implemented or performed with a processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The aspects disclosed herein may be embodied in hardware and in instructions that are stored in hardware, and may reside, for example, in Random Access Memory (RAM), flash memory, Read Only Memory (ROM), Electrically Programmable ROM (EPROM), Electrically Erasable Programmable ROM (EEPROM), registers, a hard disk, a removable disk, a CD-ROM, or any other form of computer readable medium known in the art. An exemplary storage medium is coupled to the processor such that the processor can read information from, and write information to, the storage medium. In the alternative, the storage medium may be integral to the processor. The processor and the storage medium may reside in an ASIC. The ASIC may reside in a remote station. In the alternative, the processor and the storage medium may reside as discrete components in a remote station, base station, or server.

It is also noted that the operational steps described in any of the exemplary aspects herein are described to provide examples and discussion. The operations described may be performed in numerous different sequences other than the illustrated sequences. Furthermore, operations described in a single operational step may actually be performed in a number of different steps. Additionally, one or more operational steps discussed in the exemplary aspects may be combined. It is to be understood that the operational steps illustrated in the flow chart diagrams may be subject to numerous different modifications as will be readily apparent to one of skill in the art. Those of skill in the art will also understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples and designs described herein, but is to be accorded the widest scope consistent with the principles and novel features disclosed herein.

What is claimed is:

1. A middle-of-line (MOL) temperature sensor for an integrated circuit (IC), comprising:
    an active semiconductor layer;
    a metal resistor having a resistance and comprising a first metal material disposed in an MOL layer disposed above the active semiconductor layer, wherein the resistance of the metal resistor is a function of an ambient temperature of the metal resistor;
    a first contact disposed above the metal resistor in the MOL layer, the first contact electrically coupled to a first contact area of the metal resistor;
    a second contact disposed above the metal resistor in the MOL layer, the second contact electrically coupled to a second contact area of the metal resistor, wherein the metal resistor has a resistance between the first contact area and the second contact area;
    a first interconnect disposed in a first interconnect layer above the MOL layer in the active semiconductor layer, the first interconnect layer electrically coupled to the first contact to electrically couple the first interconnect to the first contact area of the metal resistor; and
a second interconnect disposed in a second interconnect layer above the MOL layer in the active semiconductor layer, the second interconnect layer electrically coupled to the second contact to electrically couple the second interconnect to the second contact area of the metal resistor,
wherein the MOL layer has a thickness of approximately eighteen (18) nanometers (nm) or less.

2. The MOL temperature sensor of claim 1, wherein a change in the resistance of the metal resistor is a function of a change in the ambient temperature of the metal resistor.

3. The MOL temperature sensor of claim 1, wherein:
the active semiconductor layer comprises a first semiconductor device; and
the metal resistor is disposed in the MOL layer adjacent to the first semiconductor device to be exposed to an ambient temperature of the first semiconductor device.

4. The MOL temperature sensor of claim 3, wherein:
the first semiconductor device comprises a transistor comprising a source, a drain, and a gate interdisposed between the source and the drain; and
the metal resistor is disposed in the MOL layer adjacent to the gate of the transistor to be exposed to an ambient temperature of the gate of the transistor.

5. The MOL temperature sensor of claim 4, wherein:
the gate comprises:
 a dielectric layer comprising a dielectric material;
 a conductive layer comprising a conductive material;
 a work function layer comprising a work function material disposed between the dielectric material and the conductive material; and
the first metal material comprises the work function material.

6. The MOL temperature sensor of claim 3, wherein the metal resistor is located in the MOL layer within approximately seven (7) nanometers (nm) of the first semiconductor device.

7. The MOL temperature sensor of claim 1, wherein the first interconnect is comprised of a first metal line, and the second interconnect is comprised of a second metal line.

8. The MOL temperature sensor of claim 1, further comprising:
a first vertical interconnect access (via) disposed in the first interconnect layer, the first via in contact with the first contact area of the metal resistor and the first interconnect, to electrically couple the first contact area to the first interconnect; and
a second via disposed in the second interconnect layer, the second via in contact with the second contact area of the metal resistor and with the second interconnect, to electrically couple the second contact area to the second interconnect.

9. The MOL temperature sensor of claim 1, wherein the first metal material comprises tungsten.

10. The MOL temperature sensor of claim 1, wherein a size of the metal resistor is approximately W/L of 0.21 μm/0.21 μm.

11. The MOL temperature sensor of claim 1, wherein the resistance of the metal resistor is at least 400 ohms per W/L ratio of 1.0 μm/1.0 μm.

12. The MOL temperature sensor of claim 1 integrated into a system-on-a-chip (SoC).

13. The MOL temperature sensor of claim 1 integrated into a device selected from the group consisting of: a set top box; an entertainment unit; a navigation device; a communications device; a fixed location data unit; a mobile location data unit; a mobile phone; a cellular phone; a smart phone; a tablet; a phablet; a computer; a portable computer; a desktop computer; a personal digital assistant (PDA); a monitor; a computer monitor; a television; a tuner; a radio; a satellite radio; a music player; a digital music player; a portable music player; a digital video player; a video player; a digital video disc (DVD) player; a portable digital video player; and an automobile.

14. A middle-of-line (MOL) metal resistor temperature sensor, comprising:
a means of forming an active semiconductor layer;
a means for forming a MOL layer above the means for providing the active semiconductor layer;
a means for forming a resistance disposed in the means for forming the MOL layer, the means for forming the resistance further comprising a means for providing the resistance between a first means for providing a first contact area and a second means for providing a second contact area, wherein the resistance is a function of an ambient temperature of the means for providing the resistance;
a first contacting means disposed above the means for providing the resistance for electrically coupling to the first means for providing the first contact area;
a second contacting means disposed above the means for providing the resistance for electrically coupling to the second means for providing the second contact area;
a first means for electrically coupling to the first contacting means, the first means for electrically coupling disposed in a first interconnect layer above the means for forming the MOL layer; and
a second means for electrically coupling to the second contacting means, the second means for electrically coupling disposed in a second interconnect layer above the means for forming the MOL layer,
wherein the MOL layer has a thickness of approximately eighteen (18) nanometers (nm) or less.

* * * * *